(12) United States Patent
Leach

(10) Patent No.: US 8,138,417 B2
(45) Date of Patent: Mar. 20, 2012

(54) UNDERGROUND STORAGE OF OPERATIONAL ELECTRONIC EQUIPMENT

(76) Inventor: Dana N. Leach, Vaughn, MT (US)

( * ) Notice: Subject to any disclaimer, the term of this patent is extended or adjusted under 35 U.S.C. 154(b) by 476 days.

(21) Appl. No.: 12/382,817

(22) Filed: Mar. 24, 2009

(65) Prior Publication Data
US 2010/0243655 A1 Sep. 30, 2010

(51) Int. Cl.
H05K 5/00 (2006.01)
H05K 7/20 (2006.01)
H01J 15/00 (2006.01)
H01J 5/00 (2006.01)

(52) U.S. Cl. .......... 174/17 VA; 174/17 R; 174/37; 174/38; 174/39; 174/50; 174/50.51; 174/17.05; 174/17.06; 174/482; 174/522

(58) Field of Classification Search .......... 174/37–39, 174/17 VA, 47, 50, 17 R, 50.51, 482, 486, 174/522; H05K 5/00, 7/20
See application file for complete search history.

(56) References Cited

U.S. PATENT DOCUMENTS

| | | | | |
|---|---|---|---|---|
| 3,164,666 A | * | 1/1965 | Guglielmo | 174/17 R |
| 3,670,276 A | * | 6/1972 | Theodore | 336/92 |
| 3,710,002 A | * | 1/1973 | Link | 174/18 |
| 3,825,148 A | * | 7/1974 | Hunter et al. | 220/359.1 |
| 4,005,341 A | * | 1/1977 | Uptegraff et al. | 361/38 |
| 4,022,317 A | * | 5/1977 | Burgeson | 206/205 |
| 5,210,374 A | * | 5/1993 | Channell | 174/38 |
| 5,235,398 A | | 8/1993 | Miller et al. | |
| 5,722,204 A | * | 3/1998 | Stieb et al. | 52/20 |
| 5,837,934 A | | 11/1998 | Valavanis et al. | |
| 6,154,360 A | | 11/2000 | Kaczeus, Sr. et al. | |
| 6,825,658 B2 | | 11/2004 | Coates et al. | |
| 6,873,524 B2 | | 3/2005 | Kaczeus, Sr. et al. | |
| 6,978,688 B2 | | 12/2005 | Engebretson | |
| 7,016,145 B2 | | 3/2006 | Gunderson et al. | |
| 7,016,260 B2 | | 3/2006 | Bary | |
| 7,019,942 B2 | | 3/2006 | Gunderson et al. | |
| 7,143,635 B1 | | 12/2006 | Major et al. | |
| 7,385,137 B2 | * | 6/2008 | Burke et al. | 174/50 |
| 2003/0016012 A1 | | 1/2003 | Coates et al. | |
| 2003/0117893 A1 | | 6/2003 | Bary | |
| 2005/0150681 A1 | * | 7/2005 | Sawyer et al. | 174/135 |
| 2007/0130232 A1 | * | 6/2007 | Therrien et al. | 707/204 |
| 2007/0138185 A1 | * | 6/2007 | DiMaggio | 220/567 |
| 2007/0223381 A1 | | 9/2007 | Radtke | |
| 2008/0174424 A1 | | 7/2008 | Drake et al. | |
| 2008/0285385 A1 | | 11/2008 | Cherry | |
| 2008/0285754 A1 | | 11/2008 | Kezmann | |

FOREIGN PATENT DOCUMENTS

JP 63301143 * 12/1988

* cited by examiner

Primary Examiner — Quyen Leung
Assistant Examiner — Terrance Kenerly
(74) Attorney, Agent, or Firm — Richard C. Litman

(57) ABSTRACT

The underground storage of operational electronic equipment utilizes a hermetically sealable container adapted for receiving electronic equipment, such as a computer hard drive. The electronic equipment is placed in the container and electrically connected via a seal maintaining feedthrough to a facility proximate the container. The hermetically sealable container is sealed up and then buried underground.

6 Claims, 1 Drawing Sheet

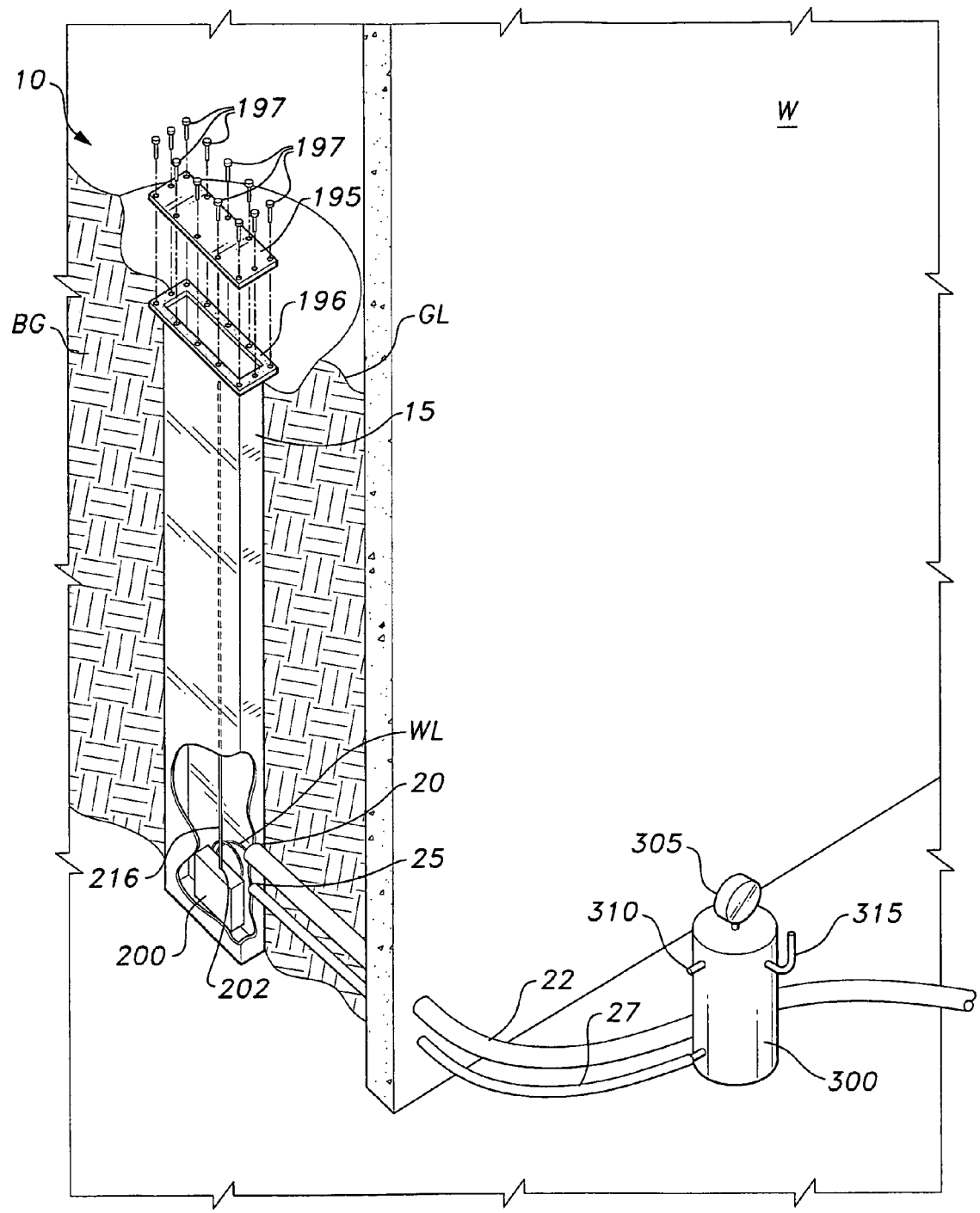

UNDERGROUND STORAGE OF OPERATIONAL ELECTRONIC EQUIPMENT

BACKGROUND OF THE INVENTION

1. Field of the Invention

The present invention relates to electronic data storage, and particularly to the underground storage of operational electronic equipment that provides a method and system for secure underground storage of data by backing up data to an underground, preferably on site location.

2. Description of the Related Art

Off-site storage is primarily handled by what is known as "tape and truck" technology. At some regularly scheduled interval, disaster recovery data back-up tapes are created by transferring all or part of a quantity of data to magnetic media, such as tapes. These tapes are then packaged and couriered, for example by an employee or courier service, to a secure, off-site storage location. Typically, this off-site storage location inventories, files and stores the back-up tapes until they are needed. More technologically advanced alternatives to the tape and truck method are being implemented on a limited basis.

However, the cost and the extent of implementing these alternatives and their effectiveness are directly proportional to the data communication transport device used. Furthermore, these alternatives are generally implemented at a remote site on dedicated data communications paths. With these dedicated remote data backup methods, the systems are usually highly customized, tailored to meet each individual user's needs, and not readily physically accessible to the user. Moreover, recovery or other use of a remotely stored data archive is generally an inconvenient proposition. Due to the aforementioned problems, there exists a long felt need for convenient, on-site secure data storage.

Thus, underground storage of operational electronic equipment solving the aforementioned problems is desired.

SUMMARY OF THE INVENTION

The underground storage of operational electronic equipment utilizes a hermetically sealable container adapted for receiving electronic equipment, such as a computer hard drive. The electronic equipment is placed in the container and electrically connected via a seal-maintaining feedthrough to a facility proximate the container. The hermetically sealable container is sealed up and then buried underground.

These and other features of the present invention will become readily apparent upon further review of the following specification and drawings.

BRIEF DESCRIPTION OF THE DRAWINGS

The sole FIGURE is an environmental, perspective view of a facility implementing underground storage of operational electronic equipment according to the present invention.

DETAILED DESCRIPTION OF THE PREFERRED EMBODIMENTS

The underground storage system 10 for operational electronic equipment provides a system 10 having a hermetically sealable container 15 adapted for receiving computer equipment 200. Preferably, computer equipment 200 has a preferably threaded connector 202 disposed on an accessible surface of the equipment. A long rod 216 having a preferably threaded end can be attached to connector 202 of equipment 200 and can subsequently be used to retrieve the equipment 200 from the container 15, should it be necessary. Moreover, in addition to making it easier to remove equipment 200 from the container 15, solid rod 216, when attached to equipment 200, keeps the equipment from moving during shipment and installation.

The container 15 has a seal flange plate 196 defining a perimeter around an open top portion of the container 15. The electronic equipment 200 is placed inside the container 15 and electrically connected to a cable 22 via cable feedthrough 20 disposed on the container 15. Electrical wires emanating from cable 22 form a wire loop WL long enough to pull the electronic equipment up and out of the container, at which point the wires would be unplugged. The feedthrough 20 is constructed so that it maintains the integrity of the sealed condition of the container 15, after the hermetically sealable container 15 is sealed up, via face plate 195, which attaches to the seal flange plate 196 using fasteners 197.

The container 15 is coupled to an air tube 27 via check valve 25, which is disposed in a side of container 15. The check valve 25 attachment to container 15 is constructed so that it maintains the integrity of the sealed condition of the container 15, after the hermetically sealable container 15 is sealed up, via attachment of face plate 195 to the seal flange plate 196.

The container 15 is then buried underground BG with the upper portion, including face plate 195, below grade level GL. Equipment 200 preferably rests on bottom portion of container 15, which is preferably at a level of approximately forty-eight inches below the ground surface to provide good temperature control of the electronic equipment. Cable 22, having been disposed through a building interior wall W, can be connected inside the building to a computing facility's computers, routers, and the like, either for primary operations or for backup operations. Air tube 27, having been disposed through the building interior wall W, can be connected inside the building to pressurization canister 300, which has a charge valve 310, a relief valve 315 and a pressure gauge 305. The pressure gauge 305 on the canister 300 monitors the pressure to indicate the integrity of the hermetically sealed container 15. A preferred gauge reading of the system 10 is approximately 4-5 lb/sq. inch to ensure ground water could never enter, even if there were physical damage to the hermetically sealed container 15 that caused a small leak. The pressure can be adjusted accordingly by personnel operating the charge canister 300 and associated valves 310 and 315.

The equipment 200 may be any electronic device, such as a data storage device, a server, a combination of data storage device(s) and server(s), or the like. A plurality of systems 15 may be installed underground at a single site or at multiple sites, locally or remotely.

It is to be understood that the present invention is not limited to the embodiment described above, but encompasses any and all embodiments within the scope of the following claims.

I claim:

1. An underground storage system for operational electronic equipment, the system comprising:
   a hermetically sealable container adapted for receiving electronic equipment, the hermetically sealable container being adapted for being buried underground;
   a cable feedthrough disposed in the container, the cable feedthrough maintaining the integrity of the sealed condition of the container while establishing a passageway from an interior of the hermetically sealed container to an exterior environment, the passageway accepting operational electrical cabling from a location exterior to the electronic equipment inside the buried hermetically sealable container;
a check valve disposed in the container;
a hollow tube connected to the check valve, the hollow tube extending away from the container;
a pressure gauge attached to the tube, the pressure gauge displaying gauge pressure inside the hermetically sealable container;
a pressurization canister attached to the tube, the pressurization canister containing inert gas and being operable to keep the container at a user-specified internal gauge pressure between approximately four and five pounds per square inch.

2. The underground storage system according to claim 1, further comprising primary data storage equipment housed by the sealable container, the container being adapted for location at an on-site facility.

3. The underground storage system according to claim 1, further comprising primary data storage equipment housed by the sealable container, the container being adapted for location at a facility off-site from a user.

4. The underground storage system according to claim 1, further comprising backup data storage equipment housed by the sealable container, the container being adapted for location at an on-site facility.

5. The underground storage system according to claim 1, further comprising backup data storage equipment housed by the sealable container, the container being adapted for location at a facility off-site from a user.

6. The underground storage system according to claim 1, further comprising:
   a rod connector disposed on the electronic equipment positioned in the container; and
   a rod attachable to the rod connector, the rod assisting in removal of the electronic equipment from the container.

* * * * *